United States Patent
Jung et al.

(10) Patent No.: US 9,460,777 B2
(45) Date of Patent: Oct. 4, 2016

(54) SRAM READ BUFFER WITH REDUCED SENSING DELAY AND IMPROVED SENSING MARGIN

(71) Applicant: QUALCOMM Incorporated, San Diego, CA (US)

(72) Inventors: Seong-Ook Jung, Seoul (KR); Younghwi Yang, Seoul (KR); Stanley Seungchul Song, San Diego, CA (US); Zhongze Wang, San Diego, CA (US); Choh fei Yeap, San Diego, CA (US)

(73) Assignees: Qualcomm Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 90 days.

(21) Appl. No.: 13/957,485

(22) Filed: Aug. 2, 2013

(65) Prior Publication Data
US 2015/0036417 A1    Feb. 5, 2015

(51) Int. Cl.
| G11C 11/419 | (2006.01) |
|---|---|
| G11C 8/16 | (2006.01) |
| G06F 17/50 | (2006.01) |
| G11C 11/412 | (2006.01) |

(52) U.S. Cl.
CPC ......... *G11C 11/419* (2013.01); *G06F 17/5072* (2013.01); *G11C 11/412* (2013.01); *G11C 8/16* (2013.01)

(58) Field of Classification Search
CPC ..... G11C 11/419; G11C 11/412; G11C 8/16; G06F 17/5072
USPC ........................ 365/154, 156, 189.15, 189.19
See application file for complete search history.

(56) References Cited

U.S. PATENT DOCUMENTS

| 7,417,890 B2 * | 8/2008 | Imai | G11C 11/412 365/154 |
|---|---|---|---|
| 7,986,566 B2 * | 7/2011 | Houston | G11C 7/1051 365/189.05 |
| 2005/0180224 A1 * | 8/2005 | Tzartzanis | G11C 7/062 365/189.09 |
| 2006/0013036 A1 * | 1/2006 | Maki | G11C 11/412 365/154 |
| 2006/0146638 A1 * | 7/2006 | Chang | G11C 11/413 365/230.05 |
| 2007/0242498 A1 * | 10/2007 | Chandrakasan | G11C 11/412 365/154 |
| 2007/0279966 A1 * | 12/2007 | Houston | G11C 11/412 365/154 |
| 2008/0080230 A1 * | 4/2008 | Liaw | G11C 7/062 365/154 |
| 2009/0161410 A1 * | 6/2009 | Houston | G11C 11/412 365/154 |
| 2009/0168483 A1 * | 7/2009 | Hsu | G11C 11/419 365/72 |

(Continued)

FOREIGN PATENT DOCUMENTS

JP    S60136095 A    7/1985

OTHER PUBLICATIONS

International Search Report and Written Opinion for International Application No. PCT/US2014/047455, ISA/EPO, Date of Mailing Dec. 5, 2014, 10 pages.

(Continued)

*Primary Examiner* — Vu Le
*Assistant Examiner* — Sung Cho
(74) *Attorney, Agent, or Firm* — Toler Law Group, PC

(57) ABSTRACT

A device includes a static random access memory (SRAM) cell and a read buffer coupled to an output of the SRAM cell. The read buffer includes an inverter and a switch. An input of the inverter is responsive to the output of the SRAM cell. A control terminal of the switch is responsive to an output of the inverter.

47 Claims, 7 Drawing Sheets

(56) References Cited

U.S. PATENT DOCUMENTS

| | | | |
|---|---|---|---|
| 2009/0168496 A1* | 7/2009 | Mikan, Jr. | G11C 11/412 365/154 |
| 2009/0279348 A1 | 11/2009 | Hirabayashi | |
| 2010/0259971 A1* | 10/2010 | Liaw | G11C 8/16 365/154 |
| 2011/0116329 A1* | 5/2011 | Koike | G11C 8/16 365/189.15 |
| 2011/0292743 A1* | 12/2011 | Zimmerman | G11C 11/412 365/189.15 |
| 2012/0281458 A1* | 11/2012 | Teman | G11C 11/412 365/156 |
| 2013/0003443 A1* | 1/2013 | Houston | G11C 11/412 365/154 |
| 2013/0064007 A1 | 3/2013 | Deng | |
| 2013/0242645 A1* | 9/2013 | Calhoun | G11C 11/412 365/154 |
| 2014/0071737 A1* | 3/2014 | Sharma | G11C 11/419 365/156 |

OTHER PUBLICATIONS

Calhoun B.H., et al., "A 256 kb 65-nm Sub-Threshold SRAM Design for Ultra-Low-Voltage Operation," IEEE Journal of Solid-State Circuits, Mar. 2007, vol. 42, No. 3, pp. 680-688.

Chang L., et al., "Stable SRAM Cell Design for the 32 nm Node and Beyond," in Proceedings of IEEE Symposium, VLSI Circuits, Jun. 2005, pp. 128-129.

Kim T.H., et al., "A 0.2 V, 480 kb Subthreshold SEAM with 1k Cells Per Bitline for Ultra-Low-Voltage Computing," IEEE Journal of Solid-State Circuits, Feb. 2008, vol. 43, No. 2, pp. 518-529.

Li Q., et al., "A 5.61 pJ, 16 kb 9T SRAM with Single-Ended Equalized Bitlines and Fast Local Write-Back for Cell Stability Improvement," in Proceedings of ESSCIRC, 2012, pp. 201-204.

Verma N, et al., "A 256 kb 65nm 8T subthreshold SRAM employing sense-amplifier redundancy" IEEE Journal of Solid-State Circuits IEEE USA, vol. 43, No. 1, Jan. 1, 2008, pp. 141-149, XP002574376 ISSN: 0018-9200.

* cited by examiner

SRAM READ BUFFER WITH REDUCED SENSING DELAY AND IMPROVED SENSING MARGIN

I. FIELD

The present disclosure is generally related to memory devices and more particularly to read buffers for memory devices.

II. DESCRIPTION OF RELATED ART

Advances in technology have resulted in smaller and more powerful electronic devices. For example, there currently exist a variety of mobile devices, such as wireless telephones, personal digital assistants (PDAs), and paging devices. The mobile devices may be small, lightweight, and easily carried by users. Wireless telephones, such as cellular telephones and Internet Protocol (IP) telephones, can communicate voice and data packets over wireless networks. Further, many wireless telephones include other types of devices that are incorporated therein. For example, a wireless telephone can also include a digital still camera, a digital video camera, a digital recorder, and an audio file player. Also, wireless telephones can process executable instructions, including software applications, such as a web browser application, that can be used to access the Internet. Wireless telephones typically use volatile memories, such as a static random access memory (SRAM), to store and access data and instructions. Wireless telephones and other mobile devices can include significant computing capabilities.

Increasingly, users expect mobile devices to include high (e.g., "fast") performance while also consuming low power (e.g., having long battery life). Supply voltages for electronic devices may be decreased to conserve power (e.g., to extend battery life of mobile devices). As supply voltages decrease, SRAM cells may exhibit reduced performance. For example, reduced supply voltages may be associated with decreased read stability of SRAM cells (e.g., where a value stored by an SRAM cell is more susceptible to being corrupted by noise). To further illustrate, a read static noise margin (RSNM) of an SRAM cell operating at a reduced supply voltage may be less than a hold static noise margin (HSNM) of the SRAM cell. That is, a data value stored at the SRAM cell may be more susceptible to noise during a read operation than while holding the data value during non-read operational states, thus potentially causing poor performance (e.g., data loss) of an electronic device that includes the SRAM cell.

III. SUMMARY

Certain SRAM configurations with a reduced supply voltage utilize a read buffer. The read buffer may be coupled between an SRAM cell and a bit line. The read buffer may "buffer" the SRAM cell during read operations, such as by providing isolation between the bit line and a storage node of the SRAM cell holding the data value to be read. However, the read buffer may degrade a sensing margin associated with reading a logical high voltage (e.g., a "one" bit value), may increase a sensing delay associated with reading a logical low voltage (e.g., a "zero" bit value), or a combination thereof. For example, the read buffer may be associated with a large leakage current that reduces an on-current-to-off-current ratio $I_{on}/I_{off}$ associated with the SRAM cell (e.g., by increasing $I_{off}$), degrading the sensing margin associated with sensing the logical high voltage due to increased similarity between on and off states. Some SRAM configurations attempt to improve the sensing margin by using particular configurations (e.g., a "buffer foot") in connection with the read buffer. However, these configurations may increase a delay associated with sensing the logical low voltage, such as by increasing a capacitance between the SRAM cell and the bit line.

A static random access memory (SRAM) cell in accordance with the present disclosure includes a read buffer having an inverter and a switch (e.g., a transistor). The read buffer is configured to enable a high sensing margin associated with sensing a one bit value stored at the SRAM cell and is further configured to enable a low sensing delay associated with sensing a zero bit value stored at the SRAM cell. For example, in at least one embodiment, an SRAM device is configured to quickly discharge a bit line via a single switch during a read-zero operation and is further configured to route (e.g., leak) current in a particular direction in order to improve a sensing margin associated with a read-one operation, as explained further below.

In a particular embodiment, a device includes a static random access memory (SRAM) cell and a read buffer coupled to an output of the SRAM cell. The read buffer includes an inverter and a switch. An input of the inverter is responsive to the output of the SRAM cell. A control terminal of the switch is responsive to an output of the inverter.

In another particular embodiment, a method of operating a static random access memory (SRAM) cell is disclosed. The method includes inverting a value stored at the SRAM cell to generate an inverted value. The value is inverted by an inverter of a read buffer associated with the SRAM cell. The method further includes controlling a control terminal of a switch of the read buffer based on the inverted value.

In another particular embodiment, a method of operating a static random access memory (SRAM) cell column is disclosed. The method includes initiating a read operation associated with a first SRAM cell of the SRAM cell column. During the read operation, a first leakage current is caused to flow from a bit line to a first read buffer of a first unselected SRAM cell of the SRAM cell column. During the read operation, a second leakage current is caused to flow from a second read buffer of a second unselected SRAM cell of the SRAM cell column to the bit line.

In another particular embodiment, an apparatus includes means for storing a value and means for buffering the value during a read operation. The means for buffering the value includes means for inverting the value to generate an inverted value and means for selectively coupling a bit line to a voltage terminal based on the inverted value.

In another particular embodiment, a computer-readable medium stores instructions executable by a processor to access a static random access memory (SRAM) cell. Accessing the SRAM cell includes inverting a value stored at the SRAM cell to generate an inverted value. The value is inverted by an inverter of a read buffer associated with the SRAM cell. Accessing the SRAM cell further includes controlling a control terminal of a switch of the read buffer based on the inverted value.

One particular advantage provided by at least one of the disclosed embodiments is a high sensing margin associated with sensing a one bit value stored at an SRAM cell. For example, by utilizing leakage currents from unselected SRAM cells to maintain charge of a pre-charged bit line, the sensing margin may be increased. Further, the techniques described herein may enable a low sensing delay associated with sensing a zero bit value stored at the SRAM cell. For example, by quickly discharging the pre-charged bit line via a single switch during a read-zero operation, sensing delay associated with sensing the zero bit value may be decreased as compared to conventional SRAM devices. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
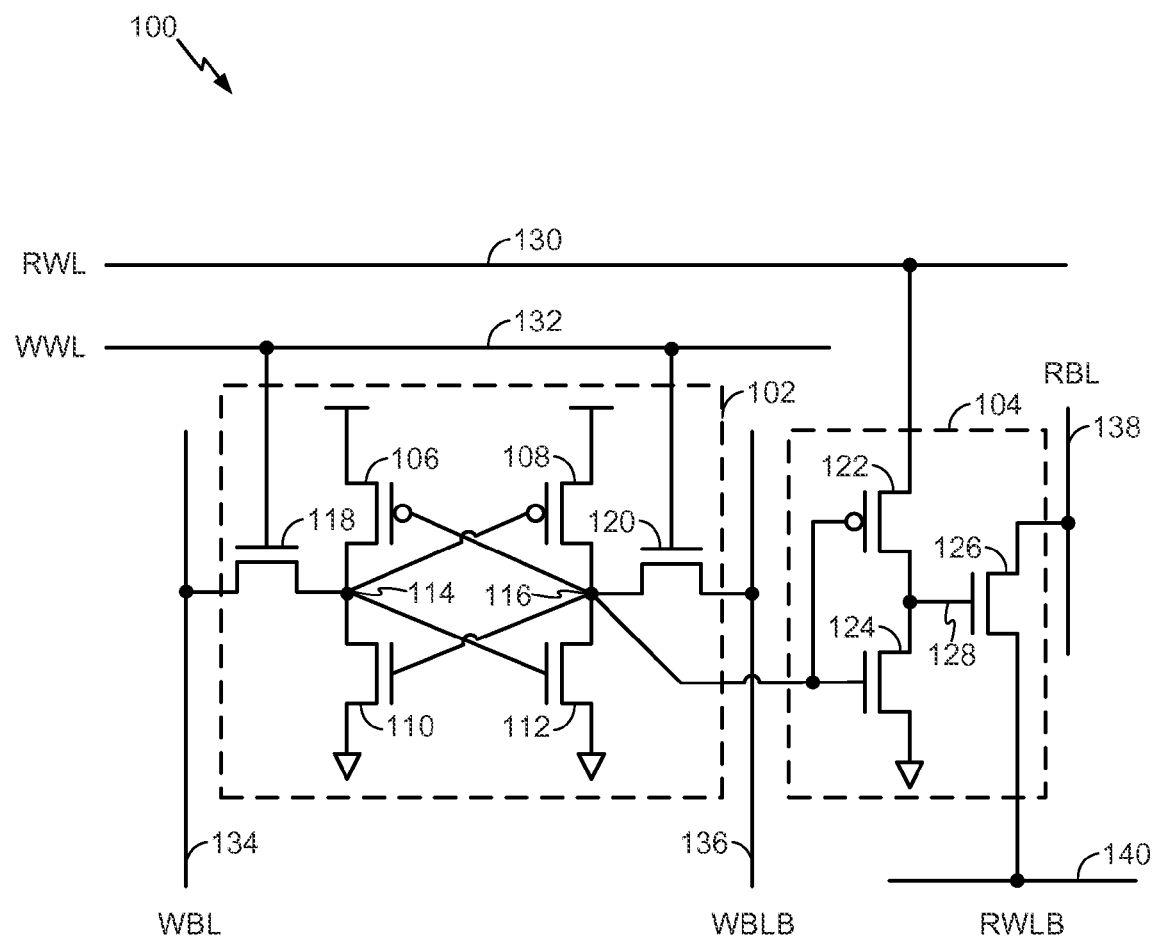
FIG. 1 is a diagram of a particular illustrative embodiment of a device that includes a static random access memory (SRAM) cell coupled to a read buffer having an inverter and a switch.

Referring to FIG. 1, a particular illustrative embodiment of a device is depicted and generally designated 100. The device 100 includes a static random access memory (SRAM) cell 102. The device 100 further includes a read buffer 104 coupled to the SRAM cell 102.

The SRAM cell 102 may include a pair of cross-coupled inverters. For example, in FIG. 1, the SRAM cell 102 includes a first inverter formed by a p-type metal-oxide-semiconductor field-effect transistor (pMOSFET) 106 coupled to an n-type metal-oxide-semiconductor field-effect transistor (nMOSFET) 110. The first inverter is cross-coupled with a second inverter formed by a pMOSFET 108 coupled to an nMOSFET 112. The pMOSFET 106 is coupled to the nMOSFET 110 via a node 114. The pMOSFET 108 is coupled to the nMOSFET 112 via a node 116.

The SRAM cell 102 may further include multiple access transistors. For example, the SRAM cell 102 includes an access transistor 118 and an access transistor 120. The access transistor 118 is coupled to a write bit line (WBL) 134. The access transistor 118 is further coupled to a write word line (WWL) 132. The access transistor 120 is coupled to the write word line 132 and to a complement write bit line (WBLB) 136. In the particular example of FIG. 1, the SRAM cell 102 has a six-transistor (6T) configuration, as illustrated. According to further embodiments, the SRAM cell 102 may be of a different configuration than the example of FIG. 1.

The read buffer 104 may be coupled to an output of the SRAM cell 102. For example, the read buffer 104 may be coupled to the node 116. According to other configurations, the read buffer 104 may be coupled to the node 114. The read buffer 104 includes a switch and an inverter. For example, the read buffer 104 may include a switch 126 responsive to an inverter formed by a pMOSFET 122 coupled to an nMOSFET 124. As illustrated in FIG. 1, the switch 126 may include an nMOSFET. Those of skill in the art will recognize that a switch may be implemented using one or more other structures. As indicated in FIG. 1, the read buffer 104 may be implemented as a three-transistor (3T) configuration that includes three transistors. Accordingly, the device 100 may be implemented as a nine-transistor (9T) configuration, as illustrated in the example of FIG. 1.

A control terminal of the switch 126 may be responsive to an output of the inverter of the read buffer 104. For example, a control terminal 128 (e.g., a gate terminal) of the switch 126 may be coupled to a drain terminal of the pMOSFET 122 and to a drain terminal of the nMOSFET 124. The control terminal 128 may be responsive to the output of the inverter by being directly coupled (e.g., connected) to the output of the inverter, as illustrated in the example of FIG. 1. As another example, the control terminal 128 may be responsive to the output of the inverter by being indirectly coupled to the output of the inverter, such as if another device component is coupled between the control terminal 128 and the output of the inverter. An input of the inverter (e.g., a connection between gate terminals of the pMOSFET 122 and the nMOSFET 124) may be responsive to the output of the SRAM cell (e.g., the node 116). A source terminal of the pMOSFET 122 may be coupled to a read word line (RWL) 130. A source terminal of the nMOSFET 124 may be coupled to a ground node (e.g., $V_{SS}$).

The switch 126 may be coupled to a bit line, such as a read bit line (RBL) 138. The switch 126 may be further coupled to a voltage terminal, such as a complement read word line (RWLB) 140. As illustrated in FIG. 1, the switch 126 may be the only component of the read buffer 104 that is coupled between the read bit line 138 and the complement read world line 140. In addition, in the example depicted in FIG. 1, a drain terminal of the switch 126 is coupled to the read bit line 138 and a source terminal of the switch 126 is coupled to the complement read word line 140.

In operation, a read operation may be initiated at the device 100 to determine a value stored at the node 116 of the SRAM cell 102. To initiate the read operation, the read bit line 138 may be pre-charged to a logically high value (e.g., $V_{DD}$). Further, the read word line 130 may be biased according to a logically high voltage, activating the inverter of the read buffer 104. If the value stored at the node 116 corresponds to a logically low voltage (e.g., a zero bit), the inverter of the read buffer 104 inverts the logically low voltage to generate a logically high voltage. The logically high voltage generated by the inverter may activate the control terminal 128 of the switch 126. Upon activation of the control terminal 128, the switch 126 may couple the pre-charged read bit line 138 to the complement read word line 140, discharging the pre-charged read bit line 138 and resulting in a read bit having a logically low voltage (e.g., a zero bit). Accordingly, the read operation may indicate that the node 116 stores a logically low voltage (e.g., a zero bit).

Alternatively, if the value stored at the node 116 corresponds to a logically high voltage (e.g., a one bit), the inverter of the read buffer 104 inverts the logically high voltage to generate a logically low voltage. The logically low voltage generated by the inverter does not activate the control terminal 128 of the switch 126. Accordingly, the switch 126 is maintained in a deactivated state. Thus, the pre-charged read bit line 138 is not discharged to the complement read word line 140 when the switch 126 is in the deactivated state. The pre-charged read bit line 138 may retain a logically high voltage, resulting in a read bit having a logically high voltage (e.g., a one bit). Accordingly, the read operation may indicate that the node 116 stores a logically high voltage (e.g., a one bit).

Because the pre-charged read bit line 138 is discharged through a single circuit element of the read buffer 104 (i.e., the switch 126 in the example of FIG. 1) when reading the zero bit, sensing delay is improved (i.e., reduced) as compared to conventional devices that discharge a read bit line through multiple transistors (e.g., serially connected transistors). For example, such multiple transistors may be associated with a capacitance that delays reading a zero bit based on a charging or discharging delay associated with the capacitance. Such a delay is reduced or avoided in the particular configuration of FIG. 1. Further, because the pre-charged read bit line 138 is discharged through a single circuit element (i.e., the switch 126 in the example of FIG. 1) when reading the zero bit, a cell current through the read buffer 104 (e.g., $I_{cell}$) is greater as compared to cell currents in conventional devices that are discharged through multiple transistors. Thus, sensing delay associated with reading a zero bit may be reduced in connection with the device 100 of FIG. 1. In addition, the configuration of FIG. 1 may enable high sensing margin when sensing a one bit stored at the SRAM cell 102, as explained further with reference to FIG. 2.

Figure 2:
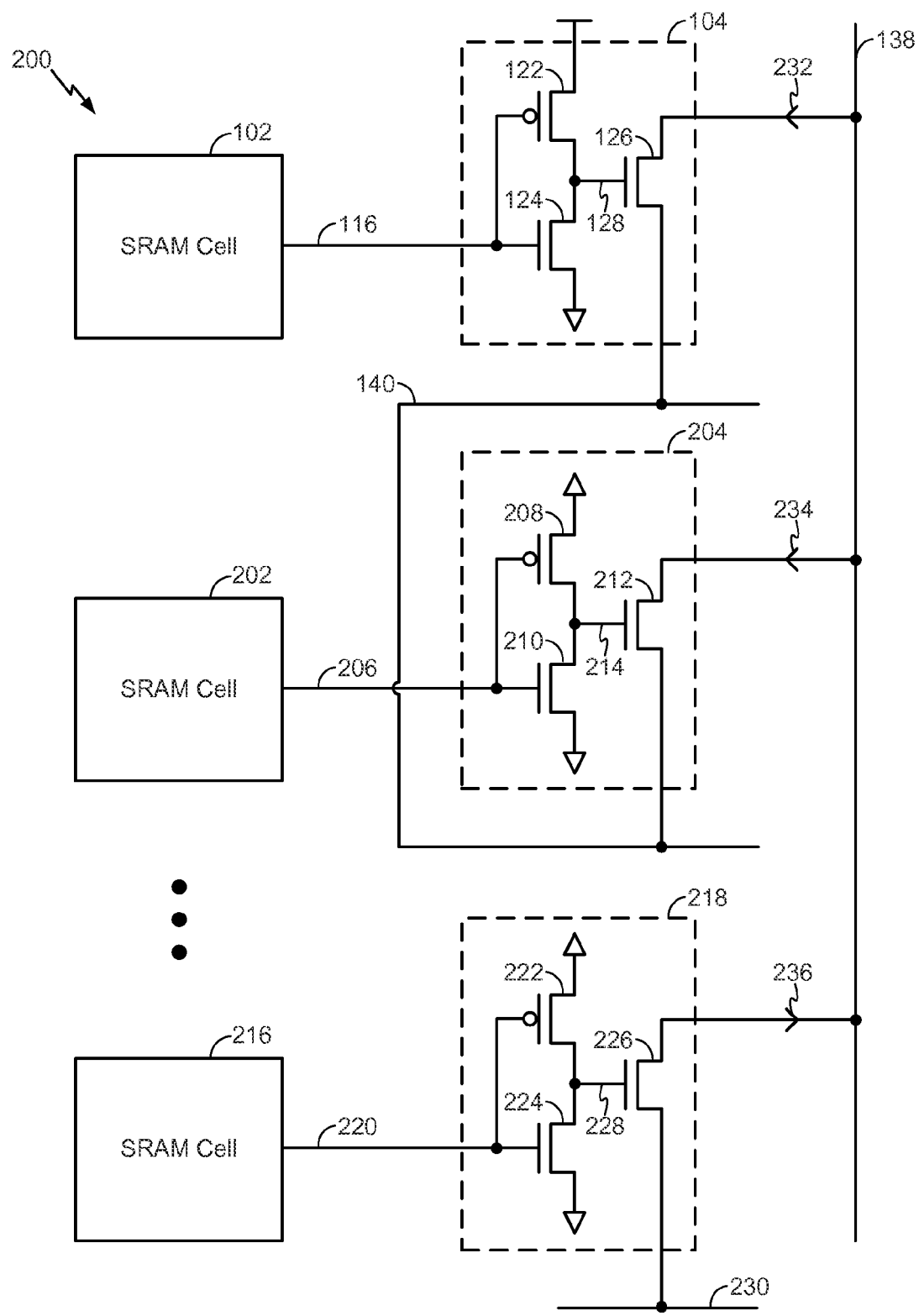
FIG. 2 is a diagram of a particular illustrative embodiment of an SRAM cell column that includes the read buffer of FIG. 1.

Referring to FIG. 2, a particular illustrative embodiment of an SRAM cell column is depicted and generally designated 200. Although FIG. 2 is described herein as an SRAM cell column 200 for convenience of illustration, it should be appreciated that the SRAM cell column 200 may correspond to a different plurality of SRAM cells (e.g., an SRAM cell row, or another group of SRAM cells), depending on the particular application.

Certain components of the SRAM cell column 200 may be as described with reference to FIG. 1. For example, the SRAM cell column 200 may include the SRAM cell 102 and the read buffer 104. The read buffer 104 is coupled to the SRAM cell 102 via the node 116. The read buffer 104 includes the switch 126 and the inverter formed by the pMOSFET 122 and the nMOSFET 124. The switch 126 includes the control terminal 128. The switch 126 is coupled to the read bit line 138 and to the complement read word line 140.

The SRAM cell column 200 may further include one or more additional SRAM cells and read buffers. For example, FIG. 2 depicts that the SRAM cell column 200 further includes a SRAM cell 202 and an SRAM cell 216. It should be appreciated that the SRAM cell column 200 may include a different number of SRAM cells than the particular example depicted in FIG. 2. For example, according to various embodiments, the SRAM cell column 200 may include several hundred or several thousand SRAM cells and read buffers.

The SRAM cell 202 is coupled to a read buffer 204 via a node 206. The read buffer 204 includes a switch 212 having a control terminal 214. The read buffer 204 further includes an inverter formed by a pMOSFET 208 coupled to an nMOSFET 210. The switch 212 is coupled to the read bit line 138 and is further coupled to the complement read word line 140.

The SRAM cell 216 is coupled to a read buffer 218 via a node 220. The read buffer 218 includes a switch 226 having a control terminal 228. The control terminal 228 of the switch 226 is coupled to an inverter formed by a pMOSFET 222 coupled to an nMOSFET 224. The switch 226 may be coupled to the read bit line 138 and may be further coupled to a complement read word line 230.

In operation, a read operation may be initiated at the SRAM cell 102 to determine a value stored at the node 116. Initiating the read operation may include pre-charging the read bit line 138 and deselecting other SRAM cells in the SRAM cell column 200. For example, FIG. 2 depicts that the SRAM cells 202, 216 have been deselected by grounding source terminals of the pMOSFETs 208, 222 (e.g., by biasing respective read word lines coupled to the pMOSFETs 208, 222 to a ground potential). During other operations, the source terminals of the pMOSFETs 208, 222 may not be coupled to ground and may be coupled to a power supply node (e.g., during other operations that do not include deselecting the SRAM cells 202, 216).

If the value stored at the node 116 corresponds to a logically high voltage (e.g., during a "read-one" operation), then the inverter of the read buffer 104 inverts the logically high voltage to generate a logically low voltage. The logically low voltage deactivates the control terminal 128 (maintains the control terminal 128 in a deactivated state), decoupling the pre-charged read bit line 138 from the complement read word line 140. While the pre-charged read bit line 138 is decoupled from the complement read word line 140, a current 232 may "leak" through the switch 126. The current 232 may flow from the pre-charged read bit line 138 to the complement read word line 140 via the switch 126. When the control terminal 128 is deactivated, the current 232 may correspond to a leakage current having a magnitude $I_{leak}$. When the control terminal 128 is activated, the current 232 may correspond to a "read" current (e.g., when the switch 126 is "on," the current 232 may have a magnitude that is greater than the magnitude $I_{leak}$).

In addition, during the read operation, a current 234 (e.g., a leakage current) may flow from the pre-charged read bit line 138 to the complement read word line 140 via the switch 212. For example, because the source terminals of the pMOSFET 208 and the nMOSFET 210 are grounded, the control terminal 214 is deactivated via a logically low voltage irrespective of the value stored at the node 206. The current 234, such as a sub-threshold leakage current, may flow through the switch 212 despite the switch 212 being deactivated. Thus, because the read buffers 104, 204 are coupled to a common complement read word line (i.e., the complement read word line 140 in the example of FIG. 2) that has a logically low voltage, the currents 232, 234 may flow in a common direction (e.g., away from the read bit line 138 and toward the complement read word line 140, as illustrated in FIG. 2).

Other read buffers of the SRAM cell column 200 may not be coupled to the complement read word line 140. For example, FIG. 2 depicts that the read buffer 218 is not coupled to the complement read word line 140 and is instead coupled to a complement read word line 230. During the read operation, the complement read word line 230 may be charged according to a logically high voltage (e.g., $V_{DD}$), indicating that the SRAM cell 216 is unselected. Accordingly, the switch 226 of the read buffer 218 is not coupled to ground and is biased according to the logically high voltage at the complement read word line 230. Thus, a current 236 associated with the read buffer 218 may flow toward the read bit line 138. The current 236 may have a magnitude $I_{leak}$.

To further illustrate, if the SRAM cell column 200 includes n cells coupled to n read buffers, then n−2 cells do not have read buffers coupled to the complement read word line 140. For example, read buffers of the SRAM cell column 200 other than the read buffers 104, 204, such as the read buffer 218, are not coupled to the complement read word line 140. Accordingly, the collective magnitude of leakage currents for unselected cells of the SRAM cell column 200 may correspond to $(n-2)*I_{leak}$ during the read-one operation associated with the SRAM cell 102. Hence, a collective leakage current having a magnitude $(n-2)*I_{leak}$ opposes a discharge of the pre-charged read bit line 138 by flowing "to" the pre-charged read bit line 138 during the read-one operation associated with the SRAM cell 102, thus maintaining the pre-charge of the read bit line RBL and improving sensing margin when reading the one bit from the read buffer 104 (e.g., by preventing or reducing a voltage drop at the read bit line 138, such as a voltage drop caused by current drawn from other components of the SRAM cell column 200).

In addition, each control terminal 214, 228 is maintained at a ground potential irrespective of values stored at the nodes 206, 220 during the read operation associated with the SRAM cell 102, as indicated in FIG. 2. For example, as described above, source terminals of the pMOSFETs 208, 222 may be grounded (e.g., by being coupled to a ground node) during the read operation associated with the SRAM cell 102. By grounding the source terminals of the pMOS-FETs 208, 222, the control terminals 214, 228 are deactivated irrespective of the values stored at the nodes 206, 220.

If the value stored at the node 116 corresponds to a logically low voltage (e.g., a zero bit), then the inverter of the read buffer 104 inverts the logically low voltage to generate a logically high voltage. The logically high voltage activates the control terminal 128 of the switch 126, coupling the pre-charged read bit line 138 to the complement read word line 140 via the switch 126. Coupling the pre-charged read bit line 138 to the complement read word line 140 discharges the pre-charged read bit line 138 via the current 232. Accordingly, when the switch 126 is activated, the current 232 may have a "read" magnitude (e.g., $I_{cell}$) that is higher than the magnitude $I_{leak}$. The current 232 may flow from the pre-charged read bit line 138 to the complement read word line 140 via the switch 126, resulting in a read bit having a logically low value (e.g., a zero bit). While reading the zero bit, operation of unselected SRAM cells in the SRAM cell column 200 may operate as described above with reference to the read-one operation. For example, the currents 234, 236 (e.g., leakage currents having magnitudes $I_{leak}$) may be generated at the read buffers 204, 218, respectively. During the read-zero operation, the control terminals 214, 228 may be maintained in a deactivated state irrespective of the values stored at the nodes 206, 220, as described above with reference to the read-one operation.

Because the leakage currents associated with one or more unselected SRAM cells in the SRAM cell column 200 (e.g., the SRAM cell 216) discharge current to the read bit line 138 while the one bit is read from the read buffer 104, a sensing margin when reading the one bit is improved (e.g., by preventing or reducing a voltage drop at the read bit line 138 caused by leakage currents flowing away from the read bit line 138). For example, the read bit line 138 may be maintained at $V_{DD}$ during a read-one operation. Accordingly, sensing margin associated with a read-one operation is improved as compared to conventional devices in which each unselected SRAM cell leaks current away from pre-charged read bit lines. The techniques described with reference to FIG. 2 may enable a greater on-current-to-off-current ratio $I_{on}/I_{off}$ associated with the SRAM cell 102 as compared to conventional SRAM configurations in which sensing margin is degraded due to leakage currents flowing away from a pre-charged bit line during a read-one operation. Accordingly, performance at the SRAM cell column 200 is improved due to the increased on-current-to-off-current ratio $I_{on}/I_{off}$ as compared to conventional devices.

Figure 3:
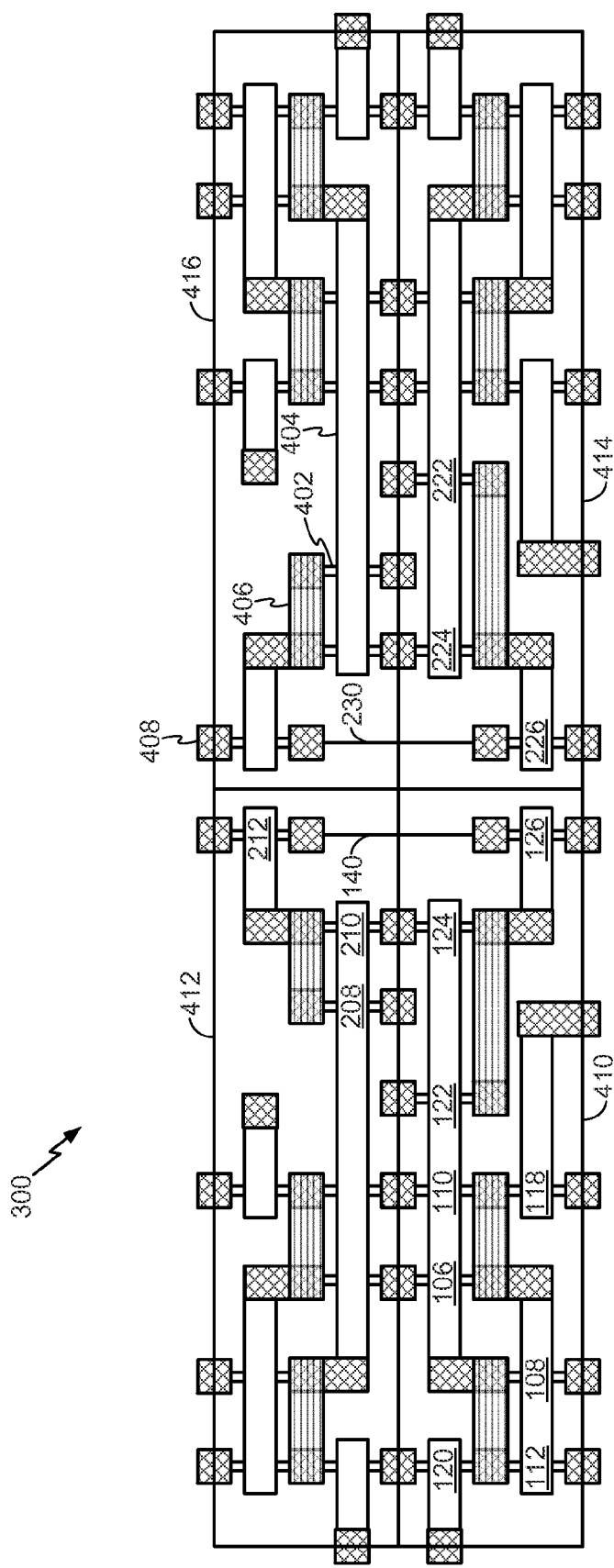
FIG. 3 is a diagram of a particular illustrative embodiment of a layout of a device that depicts certain aspects of FIGS. 1 and 2.

Referring to FIG. 3, a particular illustrative embodiment of a layout of a device is depicted and generally designated 300. In FIG. 3, transistors of the device 300 may be formed using multiple materials (e.g., layers of an integrated circuit). For example, FIG. 3 depicts an example doped region 402 (e.g., a doped region of a semiconductor substrate). As another example, FIG. 3 depicts a gate region 404 (e.g., a polysilicon region and/or gate oxide region of a transistor gate region). One or more structures of the device 300 of FIG. 3 may be coupled via an interconnect, such as an interconnect 406. Further, the device 300 may include one or more contacts coupling portions of the device 300, such as a contact 408.

The device 300 includes regions 410, 412, 414, 416. In a particular embodiment, each of the regions 410, 412, 414, 416 corresponds to devices (e.g., transistors) of an SRAM cell and a corresponding read buffer. To illustrate, the region 410 may include the pMOSFETs 106, 108, 122, the nMOS-FETs 110, 112, 124, the access transistors 118, 120, and the switch 126. As another example, the region 412 may include the pMOSFET 208, the nMOSFET 210, and the switch 212. As another example, the region 414 may include the pMOS-FET 222, the nMOSFET 224, and the switch 226.

In the example of FIG. 3, the regions 410, 412 correspond to adjacent SRAM cells that are coupled via a common complement read word line, such as the complement read word line 140. The regions 414, 416 may correspond to adjacent SRAM cells having read buffers that are coupled via a different common complement read word line, such as the complement read word line 230. In a particular illustrative embodiment, the device 300 corresponds to a layout view of a portion of the SRAM cell column 200.

FIG. 3 illustrates that the device 300 can be implemented efficiently using relatively few layers of an integrated circuit. Accordingly, a height of the device (e.g., a "cell height" of an SRAM device corresponding to the device 300) may be reduced as compared to conventional SRAM devices that are formed using more integrated circuit layers. By reducing the cell height, a capacitance (e.g., a bit line capacitance) may be reduced at the device 300 as compared to conventional devices, thus enabling faster operation (e.g., by requiring less time to charge a bit line as compared to conventional SRAM devices). Further, by coupling pairs of read buffers to respective complement read word lines, circuit area and the number of circuit components may be reduced as compared to devices in which each read buffer is coupled to a unique complement read word line. For example, by coupling pairs of read buffers to respective complement read word lines, an integrated circuit that includes the device 300 may include fewer metal layers than a conventional integrated circuit in which each read buffer is coupled to a unique complement read word line.

Figure 4:
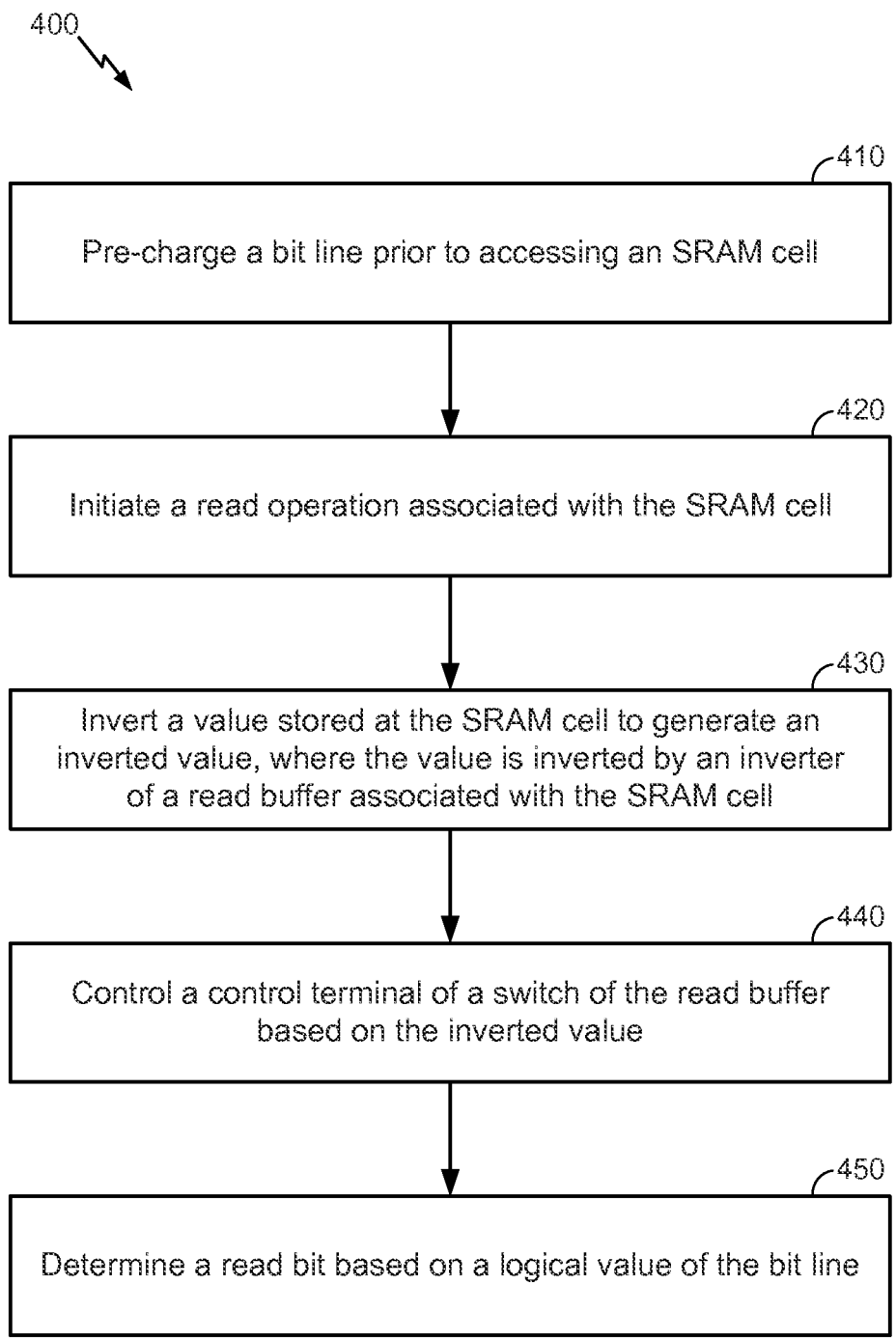
FIG. 4 is a flow chart of a particular illustrative embodiment of a method of operating the SRAM cell of FIG. 1.

Referring to FIG. 4, a particular illustrative embodiment of a method of operating an SRAM cell is depicted and generally designated 400. The SRAM cell may correspond to any of the SRAM cells described with reference to FIG. 1 through FIG. 3, such as the SRAM cell 102. The method 400 may include pre-charging a bit line prior to accessing the SRAM cell, at 410. As an example, the bit line may correspond to the read bit line 138.

The method 400 may further include initiating a read operation associated with the SRAM cell, at 420. As a particular example, the read word line 130 may be charged according to a logically high voltage to activate the inverter of the read buffer 104. As another example, source terminals of the pMOSFETs 208, 222 may be grounded (e.g., via respective read word lines).

The method 400 may further include inverting a value stored at the SRAM cell to generate an inverted value, at 430. The value is inverted by an inverter of a read buffer associated with the SRAM cell. The read buffer may correspond to the read buffer 104. The inverter may include the pMOSFET 122 and the nMOSFET 124. The value may be stored at the node 116.

The method 400 may further include controlling a control terminal of a switch of the read buffer based on the inverted value, at 440. For example, the control terminal of the switch may be coupled to or otherwise responsive to an output of the inverter. As an example, the switch may correspond to the switch 126, and the control terminal may correspond to the control terminal 128. The output of the inverter may correspond to a connection between a drain terminal of the pMOSFET 122 and a drain terminal of the nMOSFET 124.

The method 400 may further include determining a read bit based on a logical value of the bit line, at 450. For example, if the inverted value corresponds to a logical one value, controlling the control terminal of the switch may include discharging the pre-charged bit line to a voltage terminal by activating the switch. The voltage terminal may correspond to the complement read word line 140. Activating the switch and discharging the pre-charged bit line may generate a logical zero value at the bit line. Thus, activating the switch results in a read zero bit.

As another example, if the inverted value corresponds to a logical zero value, controlling the control terminal of the switch may include maintaining the switch in a deactivated state. Maintaining the switch in the deactivated state may result in a logical one value at the bit line (e.g., the bit line retains the pre-charge and is not discharged to the voltage terminal via the switch). Maintaining the switch in the deactivated state results in a read one bit.

The method 400 of FIG. 4 may enable a low sensing delay associated with sensing a zero bit value stored at the SRAM cell. For example, by quickly discharging the pre-charged bit line via a single switch during a read-zero operation, sensing delay associated with sensing the zero bit value may be decreased as compared to conventional SRAM devices that utilize serially connected transistors. Further, techniques described herein may improve a sensing margin associated with sensing a one bit value, such as by utilizing one or more leakage currents of a plurality of SRAM cells (e.g., an SRAM cell column), as described further with reference to FIG. 5.

In addition, after determining the bit value stored at the SRAM cell, one or more additional operations may be performed at a memory device that includes the SRAM cell (e.g., an SRAM array). For example, one or more SRAM cells of the memory device may be selected for read operations, write operations, or a combination thereof. Alternatively or in addition, a standby mode of operation associated with the memory device may be initiated. The control terminal is maintained in a deactivated state during the standby mode of operation. For example, the control terminal of the switch may be biased at a logical zero value during the standby mode of operation. The standby mode of operation may be initiated when the memory device is inactive, such as after performing the read operation and upon determining that no additional read operations or write operations are scheduled to occur at the memory device. The standby mode of operation may be initiated for each SRAM cell of the memory device.

In a particular embodiment, transistors of the read buffer are biased such that a drain-to-source voltage ($V_{DS}$) of each of the transistors is zero during the standby mode of operation. For example, during the standby mode of operation, source terminals of the pMOSFET 122 and the nMOSFET 124 may be biased at a common voltage (e.g., at a ground voltage). Further, the read bit line 138 and the complement read word line 140 may be biased at a common voltage (e.g., at $V_{DD}$) during the standby mode of operation, thus maintaining terminals of the switch 126 (e.g., source and drain terminals) at a common voltage during the standby mode of operation.

Accordingly, drain-to-source voltages of the transistors of the read buffer may be approximately zero during the standby mode of operation, reducing leakage current through the read buffer during the standby mode of operation as compared to during the read operation. Therefore, leakage current through the read buffer during standby operation, including "sub-threshold" or "static" leakage current, is reduced or eliminated. For example, leakage current through the read buffer is reduced as compared to a conventional SRAM configuration in which leakage current flows from a read bit line through a read buffer during standby operation. Reducing leakage current using the standby mode of operation may conserve power, such as battery power of a mobile device.

Figure 5:
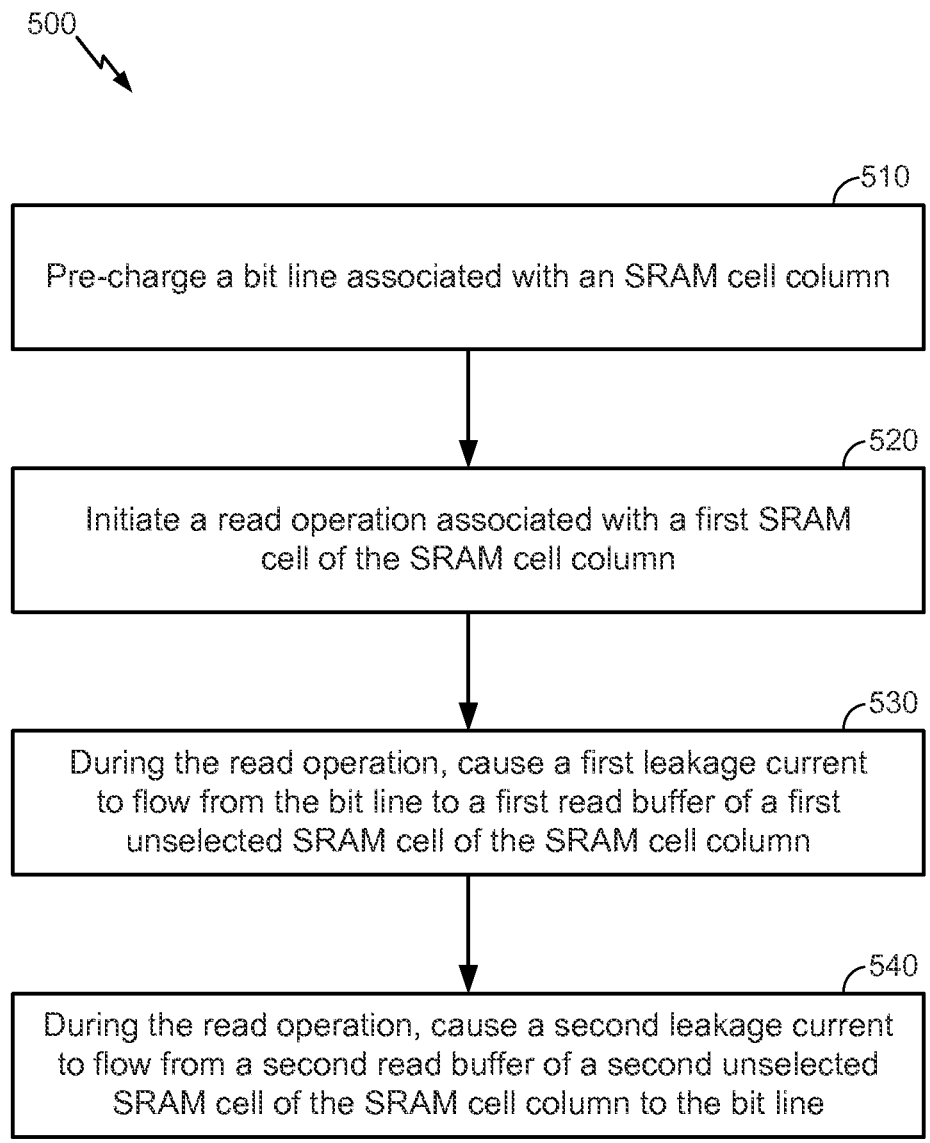
FIG. 5 is a flow chart of a particular illustrative embodiment of a method of operating the SRAM cell column of FIG. 2.

Referring to FIG. 5, a particular illustrative embodiment of a method of operating an SRAM cell column is depicted and generally designated 500. The SRAM cell column may correspond to the SRAM cell column 200 of FIG. 2. The method 500 may include pre-charging a bit line associated with the SRAM cell column, at 510. The bit line may correspond to the read bit line 138 of FIG. 1.

A read operation associated with a first SRAM cell of the SRAM cell column may be initiated, at 520. The first SRAM cell may correspond to any of the SRAM cells described with reference to FIGS. 1 and 2, such as the SRAM cell 102. During the read operation, a first leakage current may flow from the bit line to a first read buffer of a first unselected SRAM cell of the SRAM cell column, at 530. For example, the first read buffer and the first unselected SRAM cell may correspond to the read buffer 204 and the SRAM cell 202, respectively. The first leakage current may correspond to the current 234.

During the read operation, a second leakage current may flow from a second read buffer of a second unselected SRAM cell of the SRAM cell column to the bit line, at 540. The second read buffer and the second SRAM cell may correspond to the read buffer 218 and the SRAM cell 216. The second leakage current may correspond to the current 236. In a particular embodiment, the first leakage current and the second leakage current each have a magnitude $I_{leak}$. If the SRAM cell column includes n SRAM cells, a collective magnitude of leakage currents flowing to the bit line may correspond to $(n-2)*I_{leak}$, as explained with reference to FIG. 2.

Because a collective leakage current having a magnitude $(n-2)*I_{leak}$ flows to the bit line during the read operation associated with the first SRAM cell, pre-charge of the bit line may be maintained during a read-one operation. Accordingly, a sensing margin during a read-one operation may be improved due to the collective leakage current maintaining pre-charge at the bit line. For example, the sensing margin may be improved as compared to conventional devices in which leakage currents cause discharge (or partial discharge) of a bit line during a read-one operation. Sensing delay during a read-zero is also improved as compared to certain conventional SRAM devices. For example, sensing delay during a read-zero operation is improved as compared to a conventional SRAM "buffer foot" read buffer configuration in which leakage currents from unselected SRAM cells flow to a bit line during a read-zero operation. Because sensing margin during read-one operations and sensing delay during read-zero operations are each improved, the techniques described with reference to FIG. 5 may enable improved SRAM performance, resulting in better performance of electronic devices.

One or both of the method 400 of FIG. 4 and the method 500 of FIG. 5 may be performed at a circuit or a component of an electronic device that includes or accesses an SRAM memory device. For example, one or both of the method 400 of FIG. 4 and the method 500 of FIG. 5 may be performed at a field-programmable gate array (FPGA) device that includes or accesses an SRAM memory device, an application-specific integrated circuit (ASIC) that includes or accesses an SRAM memory device, a processing unit such as a central processing unit (CPU) that includes or accesses an SRAM memory device, a digital signal processor (DSP) that includes or accesses an SRAM memory device, a controller that includes or accesses an SRAM memory device, another hardware device that includes or accesses an SRAM memory device, a firmware device that includes or accesses an SRAM memory device, or a combination thereof. As an example, one or both of the method 400 of FIG. 4 and the method 500 of FIG. 5 can be performed at a processor that executes instructions, as described with respect to FIG. 6.

Figure 6:
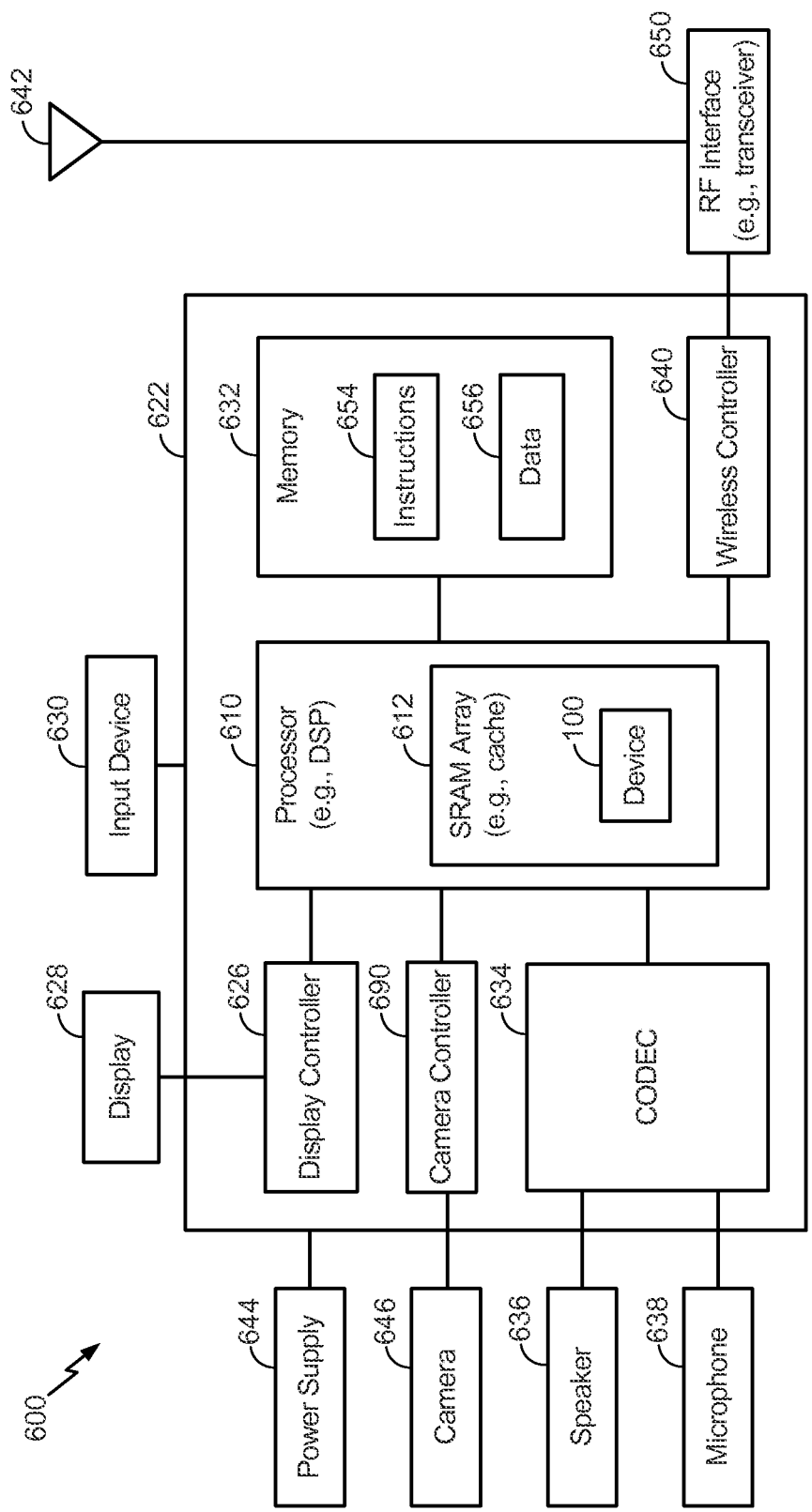
FIG. 6 is a block diagram of a mobile device that includes the device of FIG. 1.

Referring to FIG. 6, a block diagram of a particular illustrative embodiment of a mobile device is depicted and generally designated 600. The mobile device 600 includes a processor 610, such as a digital signal processor (DSP). In the example of FIG. 6, the processor 610 includes the device 100 of FIG. 1. The device 100 may be included in an SRAM array 612. The SRAM array 612 may correspond to a cache of the processor 610. According to other embodiments, the device 100 may be included at another location of the mobile device 600. For example, the SRAM array 612 may be external to the processor 610. As another example, the device 100 may be included in a different component of the mobile device 600 as compared to the particular example depicted in FIG. 6. The processor 610 may initiate certain operations at the SRAM array 612. For example, the processor 610 may initiate a read operation at an SRAM cell of the SRAM array 612.

The processor 610 may be coupled to a memory 632 (e.g., a non-transitory computer-readable medium). The memory 632 may store instructions 654, data 656, or a combination thereof. The instructions 654 may be executable by the processor 610 to perform one or more operations described herein. For example, the instructions 654 may be executable by the processor 610 to perform memory operations that include accessing the SRAM cell 102 of the device 100 (e.g., to initiate a read operation at the SRAM cell 102 of the device 100). For example, the instructions 654 may be executable by the processor 610 to cause the SRAM array 612 to enter a standby mode of operation, such as the standby mode of operation described with reference to FIG. 4. In a particular embodiment, the SRAM array 612 corresponds to a cache (e.g., an instruction cache, a data cache, or a combination thereof) that is configured to store portions of the instructions 654, the data 656, or a combination thereof.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634. The mobile device 600 may further include a camera controller 690 that is coupled to the processor 610 and to a camera 646. FIG. 6 also indicates that a wireless controller 640 can be coupled to the processor 610 and to a radio frequency (RF) interface 650 (e.g., a transceiver). The RF interface 650 may be coupled to an antenna 642.

In a particular embodiment, the processor 610, the display controller 626, the camera controller 690, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the antenna 642, the camera 646, the RF interface 650, and the power supply 644 are external to the system-on-chip device 622. However, each of the display 628, the input device 630, the speaker 636, the microphone 638, the antenna 642, the camera 646, the RF interface 650, and the power supply 644 can be coupled to a component of the system-on-chip device 622, such as to an interface or a controller.

In conjunction with the described embodiments, an apparatus includes means for storing a value (e.g., any of the SRAM cells 102, 202, 216 or any SRAM cell in the SRAM array 612) and means for buffering the value (e.g., any of the read buffers 104, 204, 218) during a read operation. The means for buffering the value includes means for inverting the value (e.g., any of the inverters of the read buffers 104, 204, 218) to generate an inverted value. The means for buffering the value further includes means for selectively coupling (e.g., any of the switches 126, 212, 226) a bit line (e.g., the read bit line 138) to a voltage terminal (e.g., any of the complement read word lines 140, 230) based on the inverted value.

In conjunction with the described embodiments, a computer-readable medium (e.g., the memory 632) stores instructions (e.g., the instructions 654) executable by a processor (e.g., the processor 610) to access an SRAM cell (e.g., any of the SRAM cells 102, 202, 216 or any SRAM cell in the SRAM array 612). Accessing the SRAM cell includes inverting a value stored at the SRAM cell to generate an inverted value. The value is inverted by an inverter (e.g., any of the inverters of the read buffers 104, 204, 218) of a read buffer (e.g., any of the read buffers 104, 204, 218) associated with the SRAM cell. Accessing the SRAM cell further includes controlling a control terminal (e.g., any of the control terminals 128, 214, 228) of a switch (e.g., any of the switches 126, 212, 226) of the read buffer based on the inverted value.

Figure 7:
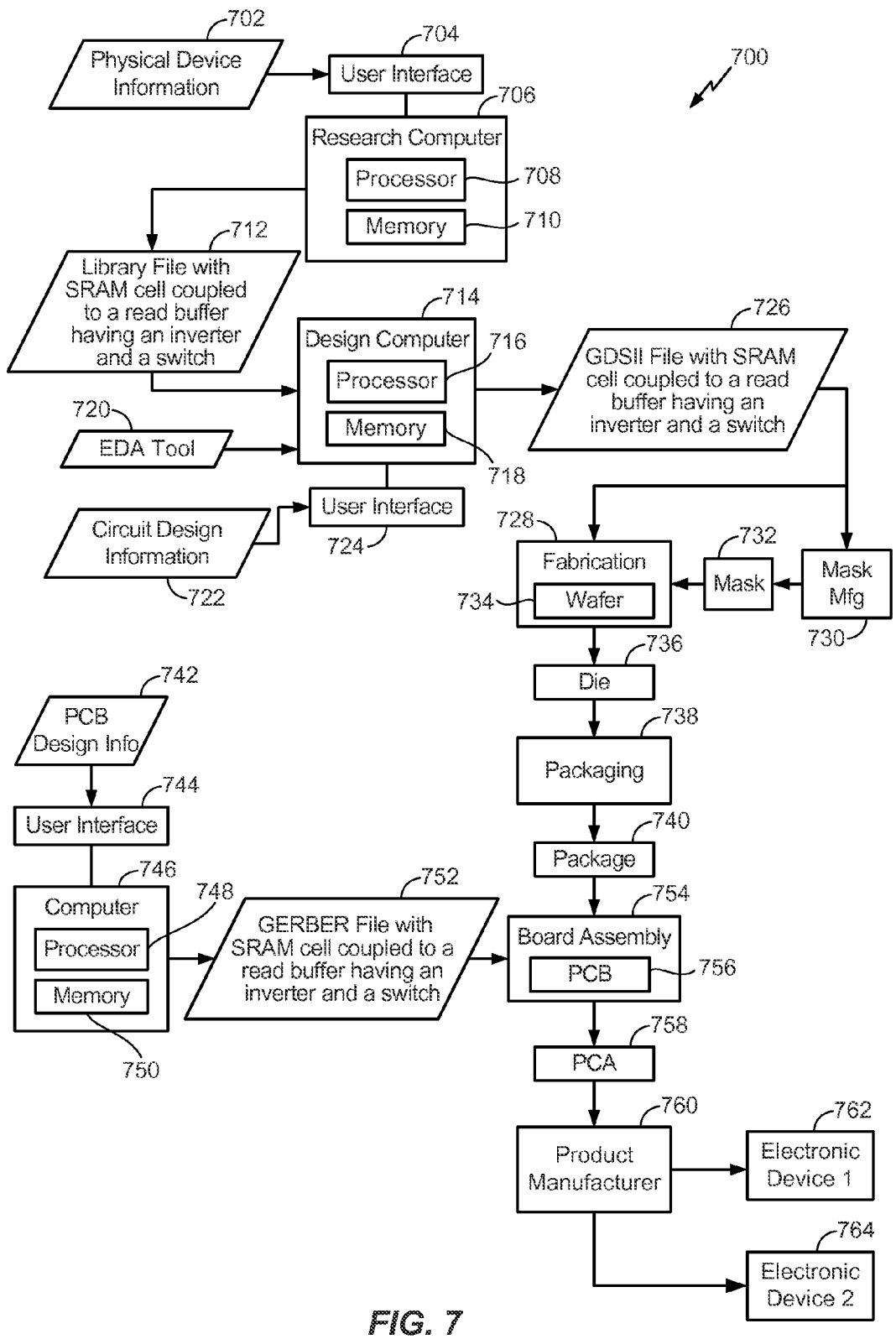
FIG. 7 is a data flow diagram of a particular illustrative embodiment of a manufacturing process to manufacture electronic devices that include an SRAM cell coupled to a read buffer having an inverter and a switch.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor dies and packaged into semiconductor chips. The chips are then employed in devices described above, such as the mobile device 600. FIG. 7 depicts a particular illustrative embodiment of an electronic device manufacturing process 700. As a particular example, a semiconductor die may include the device 100 of FIG. 1.

Referring to FIG. 7, physical device information 702 is received at the manufacturing process 700, such as at a research computer 706. The physical device information 702 may include design information representing at least one physical property of a semiconductor device that includes an SRAM cell coupled to a read buffer having an inverter and a switch, such as the device 100 of FIG. 1, the SRAM cell column 200 of FIG. 2, the device 300 of FIG. 3, or a combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes an SRAM cell coupled to a read buffer having an inverter and a switch, such as the device 100 of FIG. 1, the SRAM cell column 200 of FIG. 2, the device 300 of FIG. 3, or a combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including an SRAM cell coupled to a read buffer having an inverter and a switch, such as the device 100 of FIG. 1, the SRAM cell column 200 of FIG. 2, the device 300 of FIG. 3, or a combination thereof. For example, a user of the design computer 714 may enter circuit design information 722 via a user interface 724 coupled to the design computer 714. The circuit design information 722 may include design information representing at least one physical property of a semiconductor device, such as an SRAM cell coupled to a read buffer having an inverter and a switch, such as the device 100 of FIG. 1, the SRAM cell column 200 of FIG. 2, the device 300 of FIG. 3, or a combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing an SRAM cell coupled to a read buffer having an inverter and a switch, such as the device 100 of FIG. 1, the SRAM cell column 200 of FIG. 2, the device 300 of FIG. 3, or a combination thereof, in addition to other circuits or information. To illustrate, the data file may include information corresponding to a system-on-chip (SoC) that includes an SRAM cell coupled to a read buffer having an inverter and a switch, such as the device 100 of FIG. 1, the SRAM cell column 200 of FIG. 2, the device 300 of FIG. 3, or a combination thereof. The data file may further include information related to additional electronic circuits and components within the SoC. The SoC may correspond to the system-on-chip device 622 of FIG. 6.

The GDSII file 726 may be received at a fabrication process 728 to manufacture an SRAM cell coupled to a read buffer having an inverter and a switch, such as the device 100 of FIG. 1, the SRAM cell column 200 of FIG. 2, the device 300 of FIG. 3, or a combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a device that includes an SRAM cell coupled to a read buffer having an inverter and a switch, such as the device 100 of FIG. 1, the SRAM cell column 200 of FIG. 2, the device 300 of FIG. 3, or a combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including an SRAM cell coupled to a read buffer having an inverter and a switch, such as the device 100 of FIG. 1, the SRAM cell column 200 of FIG. 2, the device 300 of FIG. 3, or a combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including an SRAM cell coupled to a read buffer having an inverter and a switch, such as the device 100 of FIG. 1, the SRAM cell column 200 of FIG. 2, the device 300 of FIG. 3, or a combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a mobile device, a computer, a tablet, a set top box, a music player, a video player, an entertainment unit, a navigation device, a communications device, a personal digital assistant (PDA), and a fixed location data unit, into which an SRAM cell coupled to a read buffer having an inverter and a switch, such as the device 100 of FIG. 1, the SRAM cell column 200 of FIG. 2, the device 300 of FIG. 3, or a combination thereof, is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes an SRAM cell coupled to a read buffer having an inverter and a switch, such as the device 100 of FIG. 1, the SRAM cell column 200 of FIG. 2, the device 300 of FIG. 3, or a combination thereof, may be fabricated, processed, and incorporated into an electronic device, as described in the illustrative process 700. One or more aspects of the embodiments described with reference to FIGS. 1-7 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
    a static random access memory (SRAM) cell; and
    a read buffer comprising:
        an inverter that includes at least two transistors, wherein gates of the at least two transistors are responsive to an output of the SRAM cell, and wherein a first transistor of the inverter is coupled to a read word line; and
        a switch configured to selectively couple a bit line to a complement read word line, wherein a control terminal of the switch is responsive to an output of the inverter.

2. The device of claim 1, wherein the switch is activated in response to a first logical value generated by the inverter, and wherein the switch is deactivated in response to a second logical value generated by the inverter.

3. The device of claim 1, wherein the switch comprises an n-type metal-oxide-semiconductor field-effect transistor (nMOSFET).

4. The device of claim 3, wherein the control terminal corresponds to a gate terminal of the nMOSFET.

5. The device of claim 1 wherein the SRAM cell is included in a column of n distinct SRAM cells coupled to n distinct read buffers, wherein n is a positive integer, and wherein n−2 of the n distinct read buffers are not coupled to the complement read word line.

6. The device of claim 1, wherein the switch comprises a single transistor coupled between the bit line and the complement read word line, and wherein the switch is the only component of the read buffer that is coupled between the bit line and the complement read word line.

7. The device of claim 1, further comprising;
a second SRAM cell; and
a second read buffer comprising:
   a second inverter responsive to an output of the second SRAM cell; and
   a second switch configured to selectively couple the bit line to the complement read word line, wherein a second control terminal of the second switch is responsive to an output of the second inverter.

8. The device of claim 7, further comprising:
a third SRAM cell; and
a third read buffer comprising:
   a third inverter responsive to an output of the third SRAM cell; and
   a third switch configured to selectively couple the bit line to a second complement read word line, wherein a third control terminal of the third switch is responsive to an output of the third inverter.

9. The device of claim 1, further comprising at least one semiconductor die into which the SRAM cell and the read buffer are integrated.

10. The device of claim 1, further comprising at least one of a mobile device, a computer, a tablet, a set top box, a music player, a video player, an entertainment unit, a navigation device, a communications device, a personal digital assistant (PDA), or a fixed location data unit, into which the SRAM cell and the read buffer are integrated.

11. A method of operating a static random access memory (SRAM) cell, the method comprising:
   inverting a value stored at the SRAM cell to generate an inverted value, wherein the value is inverted by an inverter of a read buffer associated with the SRAM cell, the inverter of the read buffer including at least two transistors that have gates that are responsive to an output of the SRAM cell, and wherein a first transistor of the inverter is coupled to a read word line; and
   controlling a control terminal of a switch of the read buffer based on the inverted value, the switch coupled to a bit line and to a complement read word line.

12. The method of claim 11, wherein when the inverted value has a logical one value, controlling the control terminal of the switch comprises discharging the bit line to a voltage terminal by activating the switch.

13. The method of claim 12, wherein activating the switch generates a logical zero value at the bit line.

14. The method of claim 11, wherein when the inverted value has a logical zero value, controlling the control terminal of the switch comprises maintaining the switch in a deactivated state.

15. The method of claim 14, wherein maintaining the control terminal of the switch in the deactivated state results in a logical one value at the bit line that is coupled to the read buffer.

16. The method of claim 11, further comprising initiating a standby mode of operation associated with the SRAM cell, wherein the control terminal of the switch is maintained in a deactivated state during the standby mode of operation.

17. The method of claim 16, wherein the control terminal of the switch is biased at a logical zero value during the standby mode of operation.

18. The method of claim 16, wherein the complement read word line is associated with a , and wherein the bit line and the are biased at a common voltage during the standby mode of operation.

19. The method of claim 16, wherein a first source terminal of a p-type metal-oxide-semiconductor field-effect transistor (pMOSFET) of the inverter and a second source terminal of an n-type metal-oxide-semiconductor field-effect transistor (nMOSFET) are biased at a common voltage during the standby mode of operation.

20. The method of claim 19, where a leakage current through the read buffer is reduced during the standby mode of operation as compared to during a read operation.

21. The method of claim 11, wherein the SRAM cell is included in a processor integrated within an electronic device.

22. A method of operating a static random access memory (SRAM) cell column, the method comprising:
   initiating a read operation associated with a first SRAM cell of the SRAM cell column; and
   during the read operation:
      causing a first current to flow from a bit line to a first read buffer of an unselected SRAM cell of the SRAM cell column, the first read buffer including an inverter that includes at least two transistors having gates that are responsive to an output of the unselected SRAM cell, the first read buffer further including a switch coupled to the bit line and to a complement read word line, the switch responsive to an output of the inverter, wherein a first transistor of the inverter is coupled to a read word line; and
      causing a second current to flow from a second read buffer of a second unselected SRAM cell of the SRAM cell column to the bit line.

23. The method of claim 22, further comprising precharging the bit line prior to initiating the read operation, wherein the first current opposes a discharge of the bit line during the read operation.

24. The method of claim 23, wherein n indicates a number of cells in the SRAM cell column, and wherein the discharge of the bit line is opposed by n−2 leakage currents.

25. The method of claim 22, wherein the first current flows through the switch of the first read buffer during the read operation.

26. The method of claim 22, wherein the read operation is initiated by a processor integrated into an electronic device.

27. An apparatus comprising:
means for storing a value; and
means for buffering the value during a read operation of the means for storing the value, the means for buffering the value comprising:
   means for inverting the value to generate an inverted value, the means for inverting including at least two transistors, wherein gates of the at least two transistors are responsive to an output of the means for storing the value, and wherein a first transistor of the means for inverting the value is coupled to a read word line; and
   means for selectively coupling a bit line to a complement read word line based on the inverted value.

28. The apparatus of claim 27, wherein the means for storing the value comprises a static random access memory (SRAM) cell.

29. The apparatus of claim 27, wherein the means for buffering the value comprises a read buffer.

30. The apparatus of claim 29, wherein the read buffer is coupled to the output of the means for storing the value.

31. The apparatus of claim 27, wherein the means for inverting the value comprises an inverter.

32. The apparatus of claim 27, wherein the means for selectively coupling the bit line to the complement read word line comprises a switch coupled between the bit line and the complement read word line.

33. The apparatus of claim 27, further comprising a semiconductor die in which the means for storing and the means for buffering are integrated.

34. The apparatus of claim 27, further comprising at least one of a mobile device, a computer, a tablet, a set top box, a music player, a video player, an entertainment unit, a navigation device, a communications device, a personal digital assistant (PDA), or a fixed location data unit, into which the means for storing the value and the means for buffering the value are integrated.

35. A computer-readable medium storing instructions executable by a processor to access a static random access memory (SRAM) cell, wherein accessing the SRAM cell comprises:
   inverting a value stored at the SRAM cell to generate an inverted value, wherein the value is inverted by an inverter of a read buffer associated with the SRAM cell, the inverter of the read buffer including at least two transistors that have gates that are responsive to an output of the SRAM cell, and wherein a first transistor of the inverter is coupled to a read word line; and
   controlling a control terminal of a switch of the read buffer based on the inverted value, the switch coupled to a bit line and to a complement read word line.

36. The computer-readable medium of claim 35, wherein the instructions are further executable by the processor to cause the SRAM cell to enter a standby mode of operation, and wherein the control terminal of the switch is biased at a logical zero voltage during the standby mode of operation irrespective of the value stored at the SRAM cell.

37. The computer-readable medium of claim 35, wherein the read buffer has a three-transistor (3T) configuration, and wherein the SRAM cell and the read buffer have a nine-transistor (9T) configuration.

38. The computer-readable medium of claim 35, wherein the instructions are executable by the processor integrated in a device including at least one of a mobile device, a computer, a tablet, a set top box, a music player, a video player, an entertainment unit, a navigation device, a communications device, a personal digital assistant (PDA), or a fixed location data unit.

39. A method comprising:
   receiving design information representing at least one physical property of a semiconductor device, the semiconductor device comprising:
      a static random access memory (SRAM) cell; and
      a read buffer comprising:
         an inverter that includes at least two transistors, wherein gates of the at least two transistors are responsive to an output of the SRAM cell, and wherein a first transistor of the inverter is coupled to a read word line; and
         a switch coupled to a bit line and to a complement read word line, wherein a control terminal of the switch is responsive to an output of the inverter;
   transforming the design information to comply with a file format; and
   generating a data file including the transformed design information.

40. The method of claim 39, wherein the data file includes a GDSII format.

41. A method comprising:
   receiving a data file comprising design information corresponding to a semiconductor device; and
   fabricating the semiconductor device according to the design information, wherein the semiconductor device comprises:
      a static random access memory (SRAM) cell; and
      a read buffer comprising:
         an inverter that includes at least two transistors, wherein gates of the at least two transistors are responsive to an output of the SRAM cell, and wherein a first transistor of the inverter is coupled to a read word line; and
         a switch coupled to a bit line and to a complement read word line, wherein a control terminal of the switch is responsive to an output of the inverter.

42. The method of claim 41, wherein the data file has a GDSII format.

43. A method comprising:
   receiving design information comprising physical positioning information of a packaged semiconductor device on a circuit board, the packaged semiconductor device comprising:
      a static random access memory (SRAM) cell; and
      a read buffer comprising:
         an inverter that includes at least two transistors, wherein gates of the at least two transistors are responsive to an output of the SRAM cell, and wherein a first transistor of the inverter is coupled to a read word line; and
         a switch coupled to a bit line and to a complement read word line, wherein a control terminal of the switch is responsive to an output of the inverter; and
   transforming the design information to generate a data file.

44. The method of claim 43, wherein the data file has a GERBER format.

45. A method comprising:
   receiving a data file comprising design information comprising physical positioning information of a packaged semiconductor device on a circuit board; and
   manufacturing the circuit board configured to receive the packaged semiconductor device according to the design information, wherein the packaged semiconductor device comprises:
      a static random access memory (SRAM) cell; and
      a read buffer comprising:
         an inverter that includes at least two transistors, wherein gates of the at least two transistors are responsive to an output of the SRAM cell, and wherein a first transistor of the inverter is coupled to a read word line; and
         a switch coupled to a bit line and to a complement read word line, wherein a control terminal of the switch is responsive to an output of the inverter.

46. The method of claim 45, wherein the data file has a GERBER format.

47. The method of claim 45, further comprising integrating the circuit board into a device including at least one of a set top box, a music player, a video player, an entertainment unit, a navigation device, a communications device, a personal digital assistant (PDA), a fixed location data unit, or a computer.

* * * * *